US012641895B2

(12) United States Patent
Tull et al.

(10) Patent No.: US 12,641,895 B2
(45) Date of Patent: May 26, 2026

(54) OPTOELECTRONIC DEVICE INTEGRATED WITH MULTILAYER THIN-FILM CIRCUITRY

(71) Applicant: Lumiode, Inc., Bronx, NY (US)

(72) Inventors: Brian Tull, New York, NY (US);
Ioannis Kymissis, New York, NY (US);
Israel Ramirez, New York, NY (US);
Vincent Lee, New York, NY (US)

(73) Assignee: Lumiode, Inc., New York City, NY (US)

( * ) Notice: Subject to any disclaimer, the term of this patent is extended or adjusted under 35 U.S.C. 154(b) by 635 days.

(21) Appl. No.: 18/066,785

(22) Filed: Dec. 15, 2022

(65) Prior Publication Data

US 2023/0119072 A1 Apr. 20, 2023

Related U.S. Application Data

(63) Continuation of application No. PCT/US2021/037465, filed on Jun. 15, 2021.

(60) Provisional application No. 63/040,290, filed on Jun. 17, 2020.

(51) Int. Cl.
*H10F 39/00* (2025.01)
*H04N 25/532* (2023.01)
*H04N 25/77* (2023.01)
*H10F 39/18* (2025.01)

(52) U.S. Cl.
CPC ....... *H10F 39/8037* (2025.01); *H04N 25/532* (2023.01); *H04N 25/77* (2023.01); *H10F 39/016* (2025.01); *H10F 39/028* (2025.01); *H10F 39/18* (2025.01); *H10F 39/8057* (2025.01); *H10F 39/806* (2025.01); *H10F 39/811* (2025.01)

(58) Field of Classification Search
CPC .. H10F 39/8037; H10F 39/016; H10F 39/028; H10F 39/18; H10F 39/806; H10F 39/811; H10F 39/8057; H04N 25/432; H04N 25/77
USPC ......................................................... 257/291
See application file for complete search history.

(56) References Cited

U.S. PATENT DOCUMENTS

| | | | |
|---|---|---|---|
| 5,471,515 | A | 11/1995 | Fossum et al. |
| 7,485,968 | B2 | 2/2009 | Enquist et al. |
| 9,985,061 | B2 | 5/2018 | Miyamoto et al. |

(Continued)

FOREIGN PATENT DOCUMENTS

| | | |
|---|---|---|
| WO | 2019226788 | 11/2019 |
| WO | 2020146108 | 7/2020 |

OTHER PUBLICATIONS

EP Search Report mailed Jan. 31, 2025 in App. No.21826124.6-1211 / 4169069 PCT/US2021037465, 7 pages.

(Continued)

*Primary Examiner* — Phuc T Dang
(74) *Attorney, Agent, or Firm* — Cozen O'Connor

(57) ABSTRACT

An integrated circuit comprises a substrate composed of crystalline semiconductor. An optoelectronic device is formed at the substrate and includes a plurality of transducers. A thin-film semiconductor layer is situated over the optical device, and circuitry is formed at the thin-film semiconductor layer. The circuitry may include a plurality of transistors electrically coupled to the optoelectronic device by a set of layer interconnects.

23 Claims, 11 Drawing Sheets

(56) References Cited

U.S. PATENT DOCUMENTS

| | | |
|---|---|---|
| 2005/0179063 A1 | 8/2005 | Yaung et al. |
| 2007/0029591 A1 | 2/2007 | Shibayama |
| 2008/0124833 A1 | 5/2008 | Ruiz et al. |
| 2009/0034323 A1 | 2/2009 | Lung et al. |
| 2009/0090914 A1 | 4/2009 | Yano et al. |
| 2010/0012841 A1* | 1/2010 | Rafferty ............... H10F 39/184 |
| | | 250/332 |
| 2011/0108836 A1 | 5/2011 | Koyama et al. |
| 2011/0226934 A1 | 9/2011 | Hui et al. |
| 2012/0326111 A1 | 12/2012 | Cheng et al. |
| 2013/0316487 A1 | 11/2013 | De Graff et al. |
| 2017/0025466 A1 | 1/2017 | Na et al. |
| 2017/0092682 A1 | 3/2017 | Choi |
| 2017/0186800 A1 | 6/2017 | Ikeda et al. |
| 2017/0229173 A1 | 8/2017 | Brightsky et al. |
| 2018/0012938 A1 | 1/2018 | Lung et al. |
| 2018/0020169 A1 | 1/2018 | Mogi |
| 2018/0205017 A1 | 7/2018 | Bruce et al. |
| 2018/0331284 A1 | 11/2018 | Brightsky et al. |
| 2019/0013345 A1 | 1/2019 | Wan et al. |
| 2019/0157337 A1* | 5/2019 | Lin ....................... H10F 39/024 |
| 2019/0157556 A1 | 5/2019 | Brightsky |
| 2019/0305043 A1 | 10/2019 | Carta et al. |
| 2019/0305142 A1 | 10/2019 | Carta et al. |
| 2019/0325954 A1 | 10/2019 | Kim et al. |
| 2019/0364631 A1 | 11/2019 | Lee et al. |

OTHER PUBLICATIONS

International Search Report of PCT/US2021/037465 dated Oct. 6, 2021.

Written Opinion of PCT/US2021/037465 dated Oct. 6, 2021.

Shin Sakai et al., "Back-illuminated global-shutter CMOS image sensor with pixel-parallel 14bit subthreshold ADC". Sony Semiconductor Solutions Corporation, Kanagawa, Japan.

* cited by examiner

1300

1304

1302

1310

1316

1314

1312

OPTOELECTRONIC DEVICE INTEGRATED WITH MULTILAYER THIN-FILM CIRCUITRY

CROSS REFERENCE TO RELATED APPLICATIONS

This is a Continuation of International Patent Application No. PCT/US2021/037465 filed Jun. 15, 2021 having a filing date of Jun. 15, 2021, which claims the benefit of U.S. Provisional Application Ser. No. 63/040,290 filed Jun. 17, 2020, the disclosures of which are incorporated by reference herein.

TECHNICAL FIELD

This description generally relates to integrated semiconductor devices and fabrication thereof and, more particularly, to the structure and fabrication of optoelectronic devices and associated circuitry

BACKGROUND

Semiconductor-based image sensors typically use the charge generated by light absorbed in a semiconductor material to detect the presence of light. An array of such sensors may be used to produce a digital representation of an image. The advent of image sensors integrated with switch and amplification electronics (e.g., CMOS image sensors and active-pixel sensors) has revolutionized the field of imagers and allowed for a wide range of devices and new systems to be developed.

In optoelectronic devices that have electronics integrated with semiconductor imagers, it is desirable to use as much of the active semiconductor sensor area as possible for imaging. This goal may be furthered by reducing the ratio of the device area that is used for the non-image-sensing electronic circuitry. Image sensors having greater fractional utilization of the device area for light collection provide better performance with enhanced sensitivity and less noise than image sensors with comparatively less device area devoted to imaging. At the same time, there is a competing goal of providing greater functionality, such as selection and management of the signals on individual pixels, using active electronics (e.g., switching, reset, shuttering, and amplification circuitry). Hence, there is also an increasing need for device area dedicated to the non-image-sensing electronics.

A practical solution is needed to provide both, a large fractional area of the semiconductor device to be dedicated to image sensing, while also providing a substantial set of non-sensing active electronics for supporting the functionality of the device as a whole.

BRIEF SUMMARY

Various aspects of this disclosure are directed to multilayer semiconductor devices and methods of fabricating such devices. In one aspect, an integrated circuit (IC) comprises a substrate composed of crystalline semiconductor. The substrate includes a substrate top surface and a substrate bottom surface opposite the top surface. An optoelectronic device is formed at the substrate top surface and includes a plurality of transducers. A thin-film semiconductor layer is situated over the optical device, with the thin-film semiconductor layer having a thin-film top surface. The device further includes circuitry, such as a plurality of transistors, formed at the thin-film top surface. The circuitry is electrically coupled to the optoelectronic device by a set of layer interconnects.

In another related aspect, a method for fabricating a multilayer semiconductor device includes: providing a crystalline semiconductor substrate; forming first circuitry at the crystalline semiconductor substrate; depositing an isolation layer over the first circuitry; patterning the isolation layer to form apertures therein; depositing a thin-film (TF) semiconductor layer over isolation layer; forming second circuitry at the TF semiconductor layer; and interconnecting the first circuitry with the second circuitry through the apertures.

BRIEF DESCRIPTION OF THE SEVERAL VIEWS OF THE DRAWINGS

In the drawings, identical reference numbers identify similar elements or acts. The sizes and relative positions of elements in the drawings are not necessarily drawn to scale. For example, the shapes of various elements and angles are not drawn to scale, and some of these elements are arbitrarily enlarged and positioned to improve drawing legibility. Further, the particular shapes of the elements as drawn, are not intended to convey any information regarding the actual shape of the particular elements, and have been solely selected for ease of recognition in the drawings.

FIG. 9 is a simplified partial cross-sectional-view diagram illustrating a portion of another type of multilayer device according to some embodiments.

DETAILED DESCRIPTION

Figure 1:
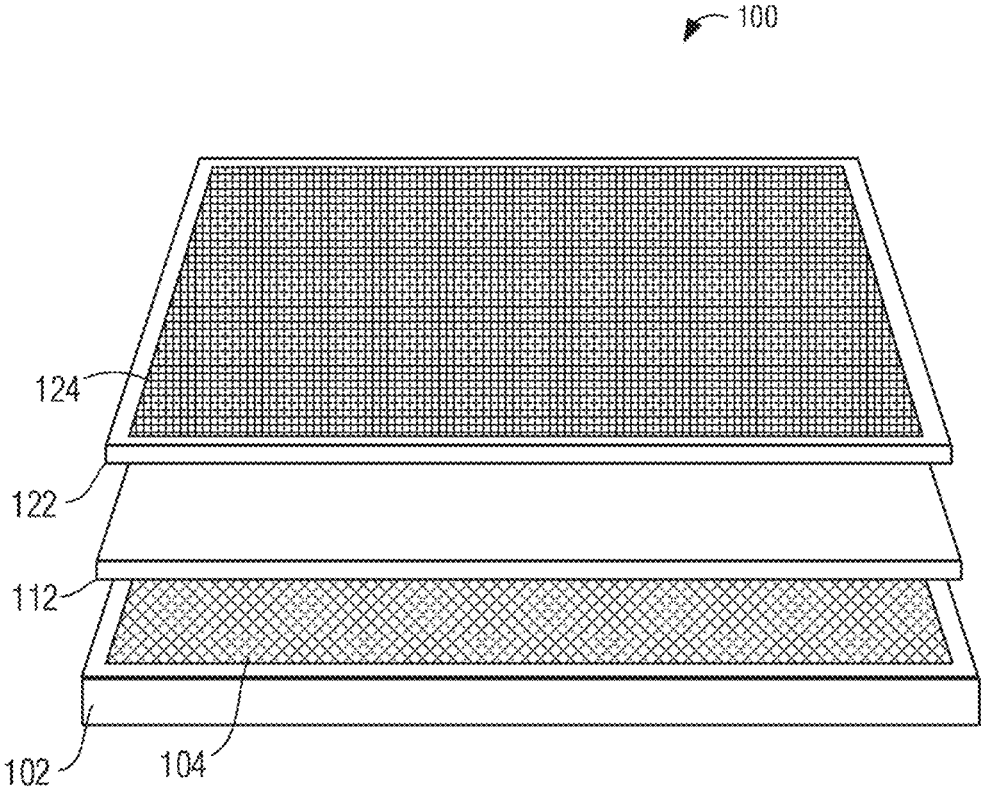
FIG. 1 is a simplified exploded-view diagram illustrating a basic structure of a layered device according to some embodiments.

In the following description, certain specific details are set forth in order to provide a thorough understanding of various disclosed embodiments. However, one skilled in the relevant art will recognize that embodiments may be practiced without one or more of these specific details, or with other methods, components, materials, etc. In other instances, certain structures associated with image sensor devices, drive circuits, integrated circuits and fabrication equipment have not been shown or described in detail to avoid unnecessarily obscuring descriptions of the various implementations and embodiments.

Unless the context requires otherwise, throughout the specification and claims which follow, the word "comprise" and variations thereof, such as, "comprises" and "comprising" are to be construed in an open, inclusive sense, that is as "including, but not limited to."

Throughout this specification instances of one or more "implementation," "embodiment," or "example" are described. These terms are used interchangeably to refer to one or more feature, structure, or characteristic of a device or process being discussed in a respective instance. Thus, the appearances of the phrases "one implementation" or "an implementation" or "in one embodiment" or "in an embodiment" or "in one example" or "in an example" in various instances throughout this specification are not necessarily all referring to the same implementation, embodiment, or example. Furthermore, the particular features, structures, or characteristics may be combined in any suitable manner in one or more implementations, embodiments, or examples even though each and every possible combination of such features, structures, or characteristics may not be expressly called out for the sake of brevity.

As used in this specification and the appended claims, the singular forms "a," "an," and "the" include plural referents unless the context clearly dictates otherwise. It should also be noted that the term "or" is generally employed in its disjunctive sense including "and/or" unless the context clearly dictates otherwise.

Aspects of this disclosure are directed to multilayer semiconductor devices and the fabrication of such devices, in which a first portion of the device is formed on a crystalline semiconductor substrate, and one or more additional portions of the device are formed on respective one or more thin-film (TF) semiconductor layers added over the substrate. Applications for such multilayer semiconductor devices include optoelectronics, such as photodetection and imaging, but are not necessarily limited to any particular application unless expressly claimed as such. In the following description of the embodiments, illustrative examples are provided for certain types of circuitry, such as optoelectronic, switching, amplification, buffering, etc., to be fabricated on the various layers of the multilayer devices. However, it will be understood that the underlying principles of these embodiments may be suitably applied to various other types of circuitry for possibly different applications consistent with the context of this disclosure.

The use of multiple layers can provide a number of advantages. For one, the device footprint may be reduced, allowing more devices to be fabricated on a wafer of a given size, thereby reducing the per-device cost. Another advantage that may be realized using multilayered circuitry, which may be particularly beneficial for optoelectronic applications, is increasing the fraction of the device area that is available for photodetection (sometimes referred to as "fill factor" or "aperture ratio"). At the same time, the multilayer structure provides additional space for non-image-sensing electronic circuitry of greater size or complexity without having to increase the device area to accommodate such circuitry. In the context of this disclosure, layers may be described as being "above," "over," "below," or "under" other layers. Such relative positioning should not be interpreted as requiring one layer to be directly adjacent another layer; rather, intermediate layers may be present between a first layer that may be situated above an underlying layer. In addition, the "up" and "down" directions are generally arbitrary and should not be interpreted as requiring that a multilayer device must be oriented in any particular direction when that device is installed or mounted in an operative configuration of an end-product. For the sake of clarity, the "bottom" of a device in the following description refers to a base layer formed from a crystalline semiconductor, and the "upward" direction refers to the direction along which successive layers are added above the base layer in fabrication of the device.

Another advantage that may be realized by some implementations is the practical fabrication of a device that has multiple different semiconductor materials that are individually fabricated using respectively different processes. For instance, a device according to one example may use silicon-based circuitry on one layer, while using indium phosphide-based circuitry on another layer. A variety of semiconductor types on different layers, numbering two, three, four, or more layers, are contemplated. Each type of semiconductor material may be employed to produce corresponding circuitry that is optimized for a particular type of functionality. For instance, one type of semiconductor may be best suited to form high-performing switching, memory, or amplification circuitry, while another type of semiconductor may be utilized to form an image sensor that is operative to sense certain wavelengths. As another example, a device may have multiple different image sensors on different respective layers (e.g., silicon, germanium, indium phosphide, or others).

FIG. 1 is a simplified exploded-view diagram illustrating a basic structure of a layered device according to some embodiments. As depicted, device 100 includes a crystalline semiconductor substrate 102 as a first layer on which a first device, such as an optoelectronic sensing device 104, is formed. The crystalline semiconductor substrate 102 may be composed of any suitable semiconductor material such as a group-IV elemental semiconductor, a group-IV compound semiconductor, a group-III-V semiconductor, and group-III-VI semiconductor, or others.

A second device layer 122 is formed over the first layer using TF processing, such as deposition of semiconductor material. TF circuitry 124 may be formed on TF device layer 122, and interconnected with the first device. As will be described in greater detail below, TF circuitry 124 may include transistor circuitry, optoelectronic circuitry, or other transducer circuitry. In some implementations, device 100 may include at least one TF isolation layer 112 interposed between successive device layers. TF isolation layer 112 may be added after formation of the optoelectronic sensing device 104 and before the addition of the second layer 122.

TF device layer 122 may be added using any suitable deposition or additive-manufacturing technique, such as growing, coating, physical deposition, chemical vapor deposition, electro-chemical deposition, molecular beam epitaxy, atomic layer deposition, or the like. TF device layer 122 may be composed of any suitable semiconductor material or composite including, but not limited to, silicon, black silicon, germanium, GaO, GaN, HgCdTe, InP, InGaAs, IGZO, SnO, ZnSnO, ZnO, polycrystalline silicon, amorphous silicon, CdSe, CuO, PbSe, PbS, diamond, organic semiconductor, transferred crystalline silicon, graphene, boron nitride, or carbon nanotube. Added TF semiconductor material may be crystalline (e.g., crystallized or recrystallized) as appropriate, for the type of device to be formed using the TF semiconductor.

Various suitable fabrication techniques may be employed to form circuitry 124 on TF device layer 122, such as masking, etching (e.g., wet etching, dry etching), patterning or lithography operations (e.g., application of a photo-resist, curing portions of the photo-resist, and removing uncured portions of the photo-resist), chemical-mechanical planarization, as well as doping, un-doping, or forming oxides.

TF isolation layer 112 may be added using a deposition or other suitable additive-manufacturing process, and may be patterned as needed to facilitate pass-through of electrical connections interconnecting TF device layers 102 and 122. Any suitable material may be used for isolation layer 112, such as silicon nitride, various oxides (e.g., silicon oxide, zinc oxide, titanium oxide, nitride-oxide composite material, amorphous silicon, or other insulating material. In some embodiments, the isolation layer material and thickness may be suitably selected to provide optical isolation whereby the isolation layer 112 is opaque at certain wavelengths of light, or to provide thermal or chemical-barrier isolation to protect the underlying layer from certain fabrication process operations such as etching, recrystallization, or the like that may be applied to form one or more device layers above the isolation layer.

Figures 2A, 2B, 2C, 2D, 2E:
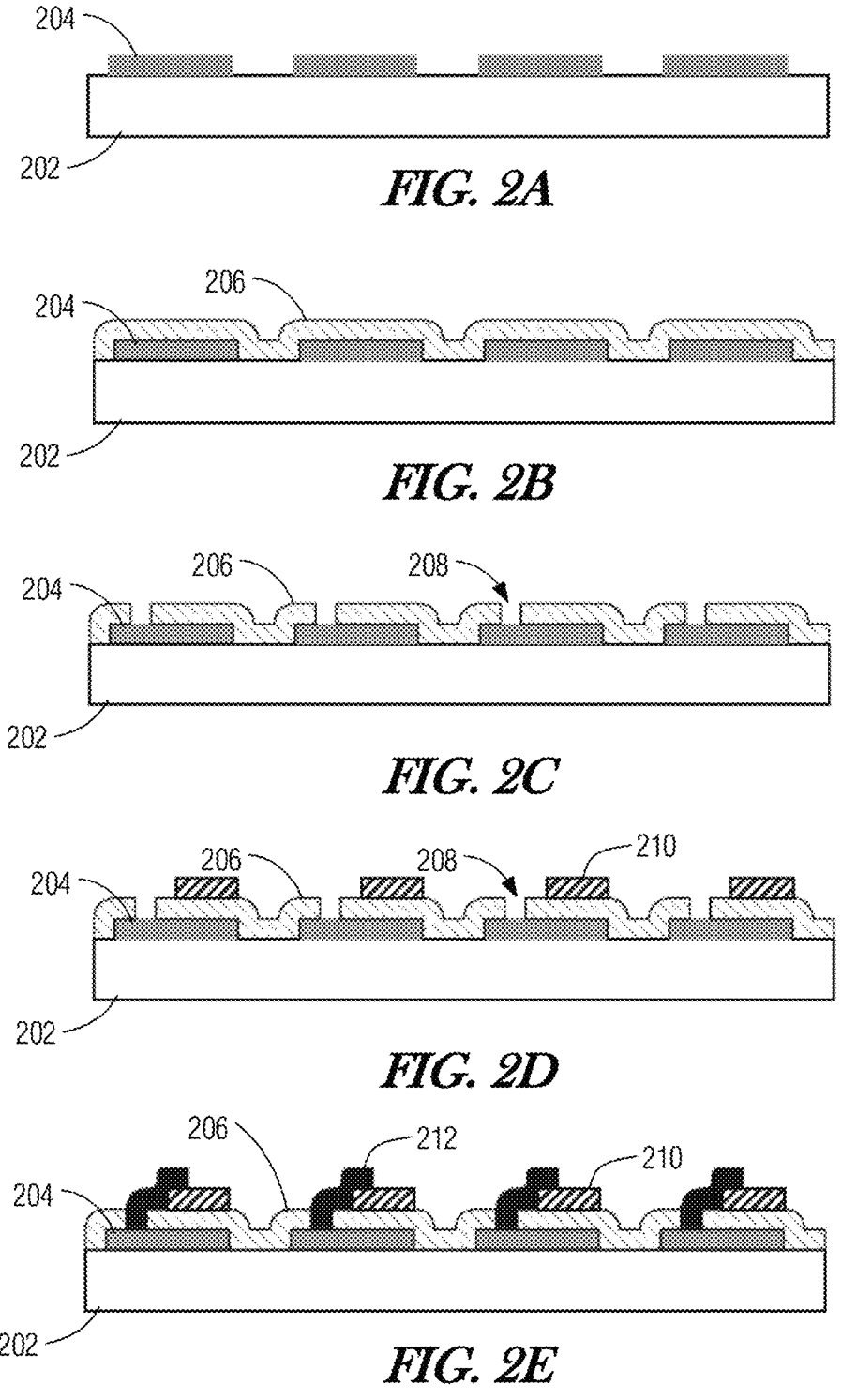
FIGS. 2A-2E are simplified partial cross-sectional-view diagrams illustrating stages of fabrication of a device according to a related aspect of the present disclosure.
Figure 3:
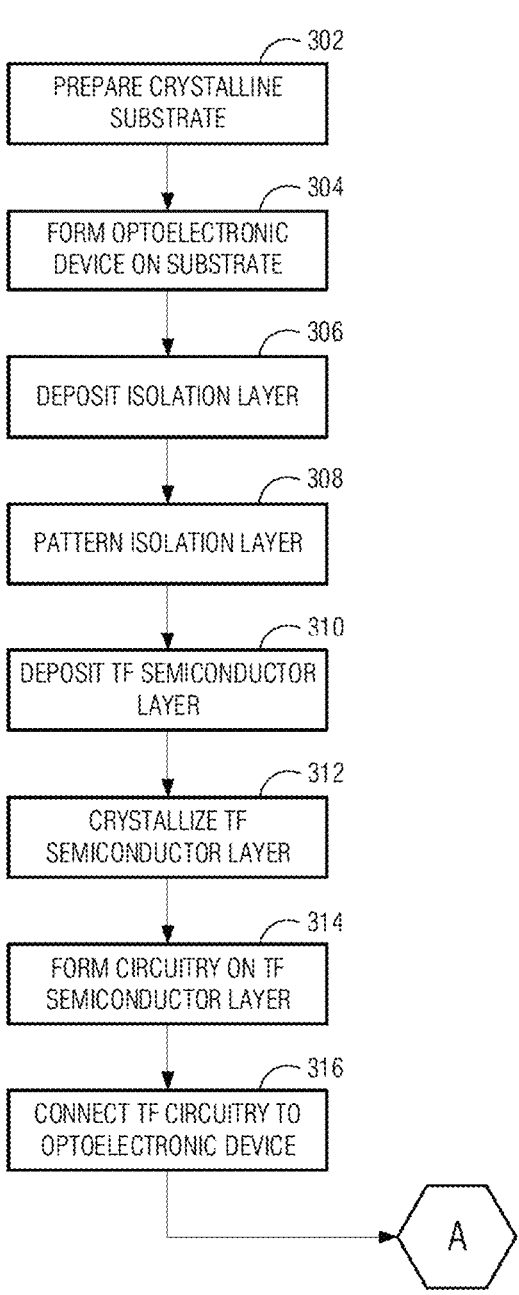
FIG. 3 is a process flow diagram illustrating an example sequence of fabrication operations that may be carried out to produce a multilayer device according to various embodiments.

FIGS. 2A-2E are simplified partial cross-sectional-view diagrams illustrating stages of fabrication of a device according to a related aspect of the present disclosure. FIG. 3 is a process flow diagram illustrating an example sequence of fabrication operations that may be carried out to produce a multilayer device according to various embodiments. Referring first to FIG. 2A and FIG. 3, at operation 302, a crystalline substrate (e.g., wafer) 202 is prepared for processing. At 304, circuitry 204, such as optoelectronic (e.g., photodetector) circuitry, is formed on substrate 202. FIG. 2B illustrates the addition if isolation layer 206, which may be added using chemical or physical vapor deposition at operation 306. FIG. 2C illustrates the result of operation 308, in which isolation layer 206 is patterned using masking, etching, or other suitable processing, to provide apertures 208 to circuitry 204 from above. Apertures 208 may be rectangular, round, L-shaped or have any suitable structure.

FIG. 2D illustrates the result of operations 310-314. At 310, a TF device layer 210, comprising a semiconductor material, is deposited. At 312, if appropriate for the type of circuitry to be formed on the TF device layer, the TF device layer 210 is recrystallized. Recrystallization may be performed using any suitable process, such as by laser heating to produce molten semiconductor material, which in turn rapidly solidifies in a crystalline molecular structure. At 314, TF circuitry is formed on TF device layer 210 by a series of operations specific to the type of TF circuitry to be formed.

The result of these operations is shown in FIG. 2D as distinct sets of TF circuitry corresponding to respective portions of circuitry 204.

FIG. 2E depicts the result of operation 316, in which the TF circuitry on TF device layer 210 is electrically connected to circuitry 204. The electrical connections may be achieved with the addition of metal, doped semiconductor, or other suitable conductive material. Additional operations, indicated at marker A in FIG. 3, may be performed to add further layers, as will be described in greater detail below with reference to FIG. 11.

Figure 4:
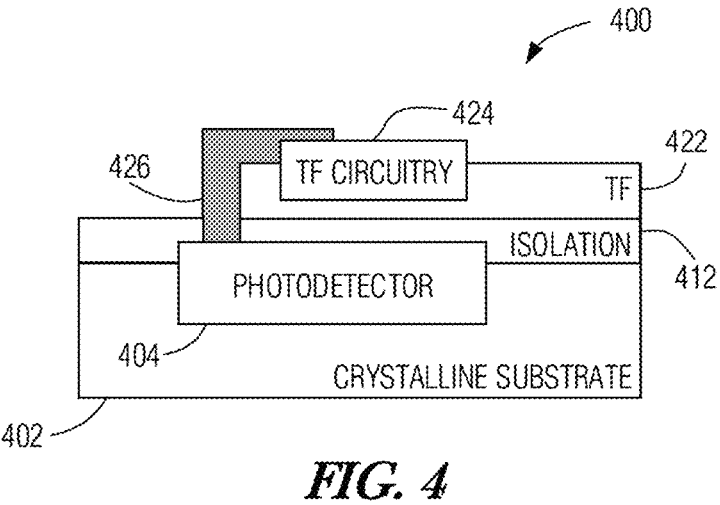
FIG. 4 is a simplified partial cross-sectional-view diagram illustrating a portion of an example multilayer device that may be produced by a process such as the fabrication process shown in FIG. 3.

FIG. 4 is a simplified partial cross-sectional-view diagram illustrating a portion 400 of an example multilayer device that may be produced by a process such as the fabrication process shown in FIG. 3. The device portion 400 shown may represent a pixel of an image sensor, for example.

Device portion 400 has a crystalline substrate 402, as its base device layer, with photodetector 404 formed thereupon. In this embodiment, the base device layer omits high-speed switching and signal-amplification circuitry.

Instead, switching and amplification circuitry for the one or more image sensors is provided by TF circuitry 424 formed on TF device layer 422. TF device layer 422 is deposited over isolation layer 412, and TF circuitry 424 is formed on TF device layer 422. Electrical interconnect 426 is electrically coupled to photodetector 404 and to TF circuitry 424. The switching functionality can include reset (enable), shutter control, addressing, logic, or other such functionality.

In some related embodiments, as shown, isolation layer 412 is interposed between photodetector 404 and TF device layer 422. Isolation layer 412 is patterned to provide interconnect access to photodetector 404, such as through an aperture.

As an example of such a device, image sensor 404 may be an infrared detector fabricated using indium phosphide (InP), which is sensitive to infrared radiation but is not suitable for producing high-quality transistors. The TF circuitry 424 may be fabricated on TF device layer 422 that includes recrystallized silicon.

Figure 5:
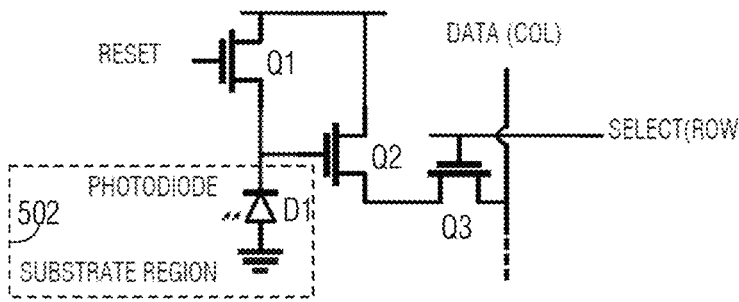
FIG. 5 is a schematic diagram illustrating an example circuit topology of a device portion according to an embodiment.

FIG. 5 is a schematic diagram illustrating an example circuit topology of device portion 400 according to an embodiment. In this example, photodetector 404 is implemented with photodiode D1 that is located on substrate region 502. TF transistors Q1-Q3 are part of TF circuitry 424. In this example, TF transistors Q1-Q3 may be implemented in PMOS. Photodiode D1 draws current from the gate of TF transistor Q2 when it senses light, turning on TF transistor Q2, which can work as a signal amplifier. TF transistor Q1 is operated by the RESET input to charge the gate of Q2, thereby turning off TF transistor Q2. TF transistor Q3 may be configured as a transmission gate that is controlled by the SELECT input to couple the drain of TF transistor Q2 to the DATA line as shown.

Employing the principles embodied in device portion 400, a multilayer device may be constructed with an image sensor comprising an array of photodetectors 404 fabricated in silicon, and occupying most of the area on the base substrate layer of the device's footprint. TF circuitry 424 in TF device layer 422 situated above the base substrate layer 402 provide switching and amplification circuitry to make the image sensor array-addressable. The image-sensing area on the device is thus preserved for photodetector elements. The TF transistor devices of the TF circuitry 424 may be based on indium gallium zinc oxide (InGZO) semiconductor of TF device layer.

Figure 6:
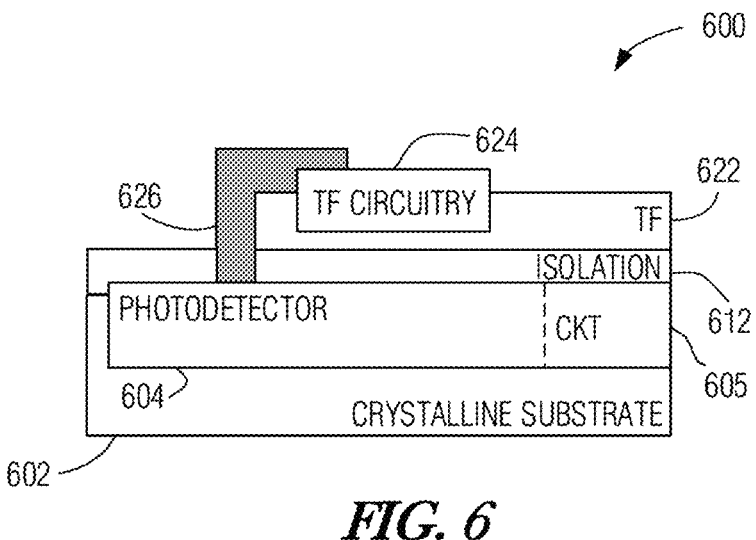
FIG. 6 is a simplified partial cross-sectional-view diagram illustrating a portion of another example multilayer device that may be produced by a process such as the fabrication process shown in FIG. 3.

FIG. 6 is a simplified partial cross-sectional-view diagram illustrating a portion 600 of another example multilayer device that may be produced by a process such as the fabrication process shown in FIG. 3. Device portion 600 differs from device portion 400 in that photodetector 604 and additional circuitry 605 are both formed on crystalline substrate 602. Additional circuitry 605 may include switching electronics, such as a photodetector-disconnect switch that may be controlled by a global shutter.

Device portion 600 further includes isolation layer 612 added over photodetector 604 and additional circuitry 605, as well as TF device layer 622 on which TF circuitry 624 is formed, and electrical interconnect 626 that passes through isolation layer 612.

Figure 7:
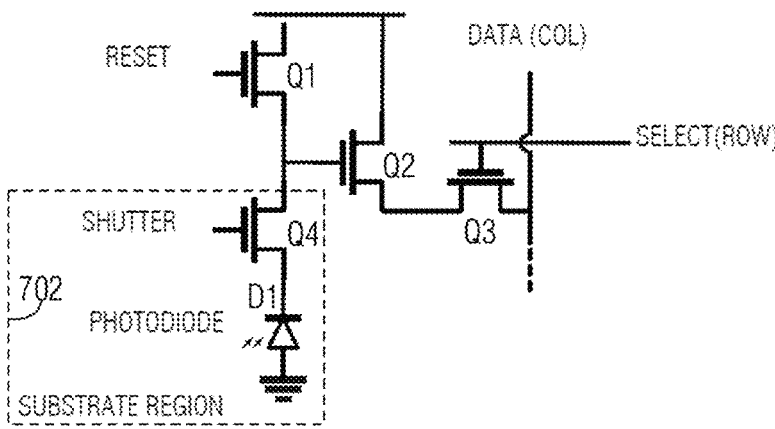
FIG. 7 is a schematic diagram illustrating an example circuit topology of device portion according to an embodiment.

FIG. 7 is a schematic diagram illustrating an example circuit topology of device portion 600 according to an embodiment. In this example, photodetector 604 is implemented with photodiode D1 that is located on substrate region 702, and additional circuitry 605 is implemented with transistor Q4 that is also located on substrate region 702. TF transistors Q1-Q3 are part of TF circuitry 624 and are arranged as described above with reference to FIG. 5. Transistor Q4 may be PMOS or NMOS. As shown, a SHUTTER input may be provided to the gate of Q4 in order to operate Q4 as a switch to selectively connect and disconnect D1 from the TF circuitry that includes TF transistors Q1-Q3. In some embodiments, the SHUTTER input may be a global shutter control that is commonly controlled for all photodiodes of the image sensor device.

Figure 8:
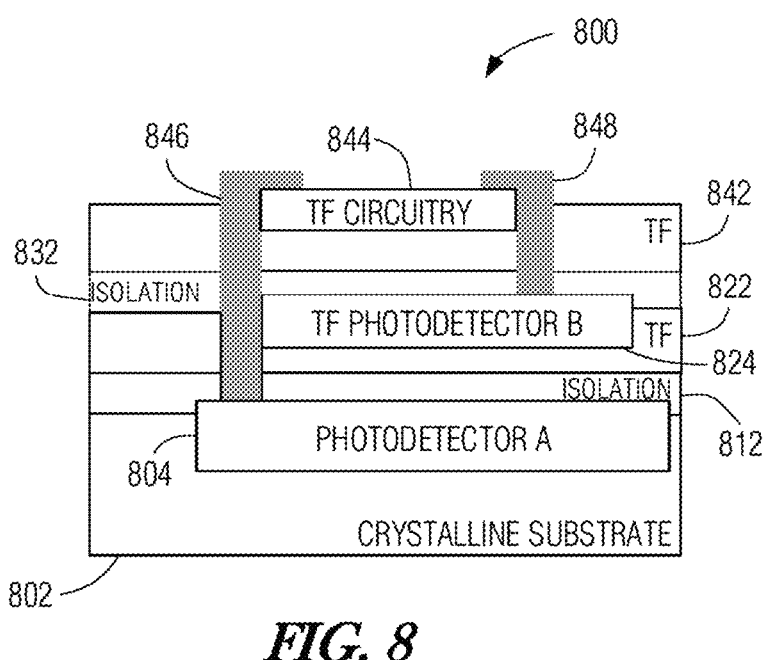
FIGS. 8 and 9 are simplified partial cross-sectional-view diagrams of respective portions of multilayer devices that have multiple thin-film device layers according to a related type of embodiment.
Figure 9:
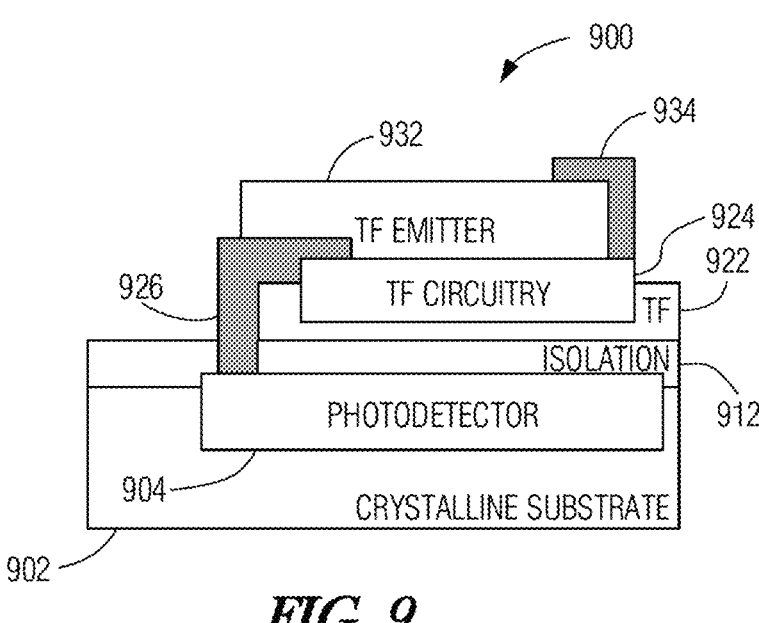

FIGS. 8 and 9 are simplified partial cross-sectional-view diagrams of respective portions of multilayer devices that have multiple TF device layers according to a related type of embodiment. As depicted in FIG. 8, crystalline substrate 802 as a base substrate layer is used to form photodetector A 804. Isolation layer 812 is situated over photodetector A. A first TF device layer 822 is situated over isolation layer 812, and a second photodetector, namely, TF photodetector B 824, is formed in TF device layer 822. Isolation layer 832 may be added over TF photodetector B 824. A second TF device layer 842 is situated over isolation layer 832, and TF circuitry 844 is formed in TF device layer 842. Interconnect 846 connects TF circuitry 844 with photodetector A 804, and interconnect 848 connects TF circuitry 844 with photodetector B 824.

In related embodiments, photodetector A 804 and photodetector B 824 are each sensitive to different ranges of wavelengths of light. For instance, photodetector A 804 may be sensitive to visible light, whereas photodetector B 824 may be sensitive to infrared light. For instance, crystalline substrate 802 may be silicon and photodetector A 804 may be silicon-based, whereas TF device layer 822 may be recrystallized germanium such that TF photodetector B is germanium-based.

In one such embodiment, the second image sensor (which contains TF photodetector B 824) is situated directly over the first image sensor (containing photodetector A 804). In the example where the second image sensor is used to detect infrared light, such a stacked arrangement is feasible since silicon is transparent to certain infrared wavelengths. In another embodiment, the second image sensor is laterally offset relative to the first image sensor and portions of the crystalline substrate 802 are removed to provide increased exposure to wavelengths of interest for the second image sensor.

TF circuitry may include switching or amplification circuitry for one or both of the photodetectors 804, 824 to make one or both of the photodetectors array-addressable. Such an architecture may permit the switching circuitry to be provided in an area separate from the photodetector elements, while allowing for the detection of two different wavelength ranges; one in the silicon base layer and one in the TF semiconductor device layer.

FIG. 9 is a simplified partial cross-sectional-view diagram illustrating a portion 900 of another type of multilayer device according to some embodiments. Photodetector 904 is formed in crystalline substrate 902 (e.g., silicon). TF Isolation layer 912 is situated over photodetector 904. TF device layer 922 is situated over isolation layer 912, and TF circuitry 924 is formed in TF device layer 922. TF circuitry 924 may include switching and amplification circuitry to make photodetector 904 array-addressable.

TF emitter device 932 is added over TF circuitry 924. TF emitter device 932 may work as a light source. In some embodiments, TF emitter 932 is an organic LED (OLED). The TF circuitry 924 may provide part of the switching functionality for the addressing of both the photodetector 904 and TF emitter 932. interconnects 926 and 934 provide electrical connections between TF circuitry 924 and photodetector 904, and between TF circuitry 924 and TF emitter 932, respectively.

In addition to the use of such devices in single-chip applications (e.g. as might be used in a camera), the stacked arrangement and co-integration of circuitry at the various layers can be beneficially implemented in multi-chip configurations, such in large-area system fabrication. The multilayered circuitry may be integrated onto areas of crystalline semiconductors with image sensing functionality, and such devices may be distributed as "chiplets" over a large area. The integration of such circuitry can allow for local control of the signals on each chiplet, thus reducing the demand on the circuitry used for co-integration and allowing for potentially superior performance on each chiplet. Such a configuration may permit the fabrication of large-area sensors based on photodetectors such as touch, x-ray, and pressure sensors, for example.

Figure 10A:
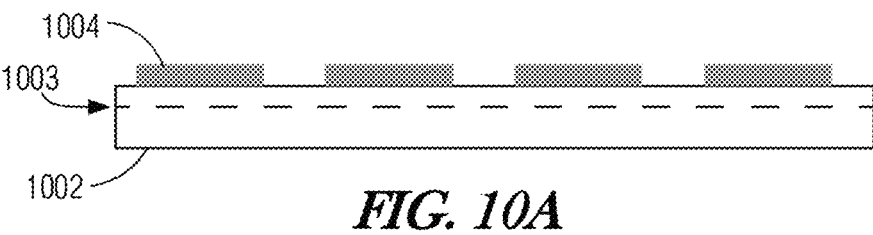
FIGS. 10A-10G are simplified partial cross-sectional-view diagrams illustrating stages of fabrication of chiplet according to a related aspect of the present disclosure.
Figure 10B:
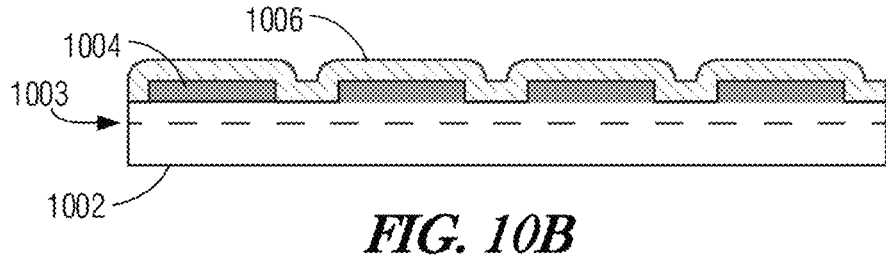
Figure 10C:
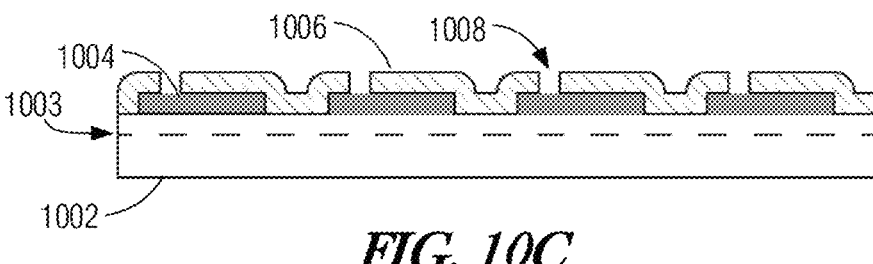
Figure 10D:
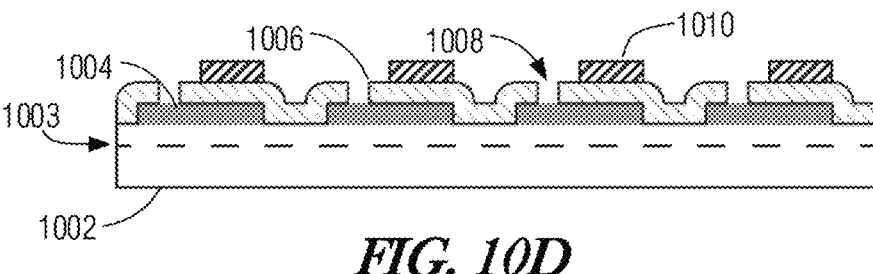
Figure 10E:
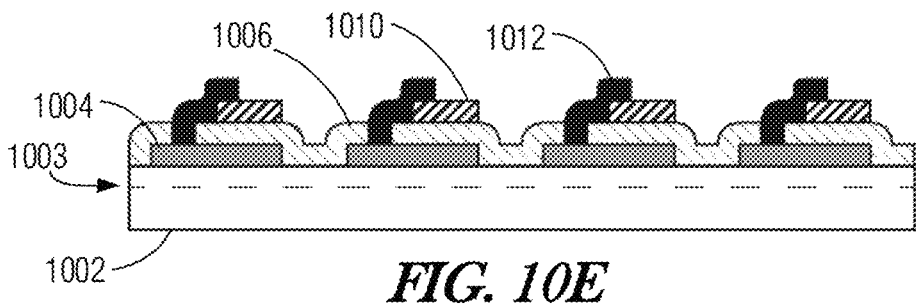
Figure 10F:
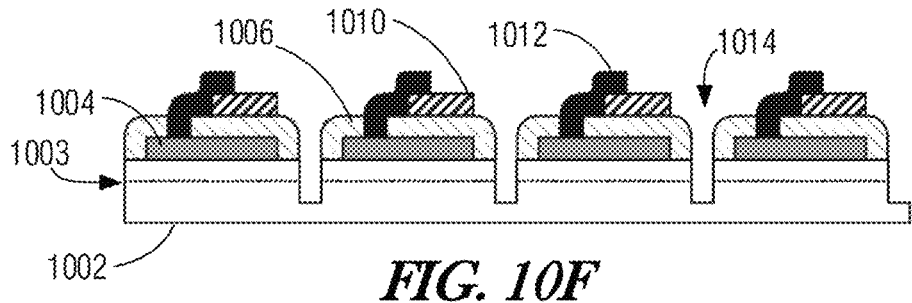
Figure 10G:
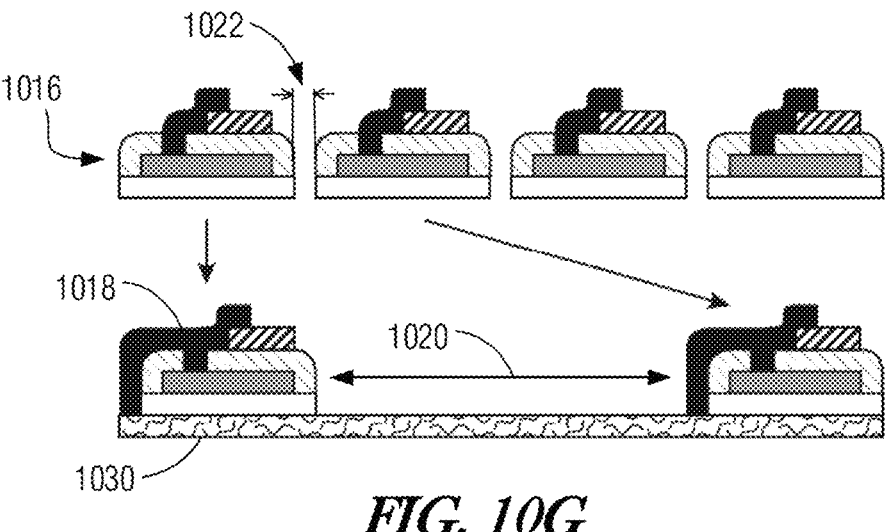

FIGS. 10A-10G are simplified partial cross-sectional-view diagrams illustrating stages of fabrication of chiplet devices according to a related aspect of the present disclosure. FIGS. 10A-10D show operations that are similar to those described above with reference to FIGS. 2A-2D, whereas FIGS. 10E-10G show additional operations that are specific to creating chiplets in accordance with the example processing operations depicted in FIG. 11.

FIG. 10A illustrates operations of preparation of crystalline substrate 1002 and formation of circuitry 1004 on the substrate 1002. As discussed in the above-described examples, circuitry 1004 may be optoelectronic circuitry or other circuitry. One aspect specific to the embodiments of FIGS. 10A-10G an intended substrate thickness is indicated at 1003. As will be described below, after formation of the multilayer device, substrate 1002 may be processed from the bottom side to reduce its thickness to intended thickness 1003.

FIG. 10B illustrates the addition of isolation layer 1006 over circuitry 1004. FIG. 10C illustrates patterning of isolation layer 1006 to produce apertures 1008 to provide electrical contacts to circuitry 1004 from above. FIG. 10D illustrates the addition of TF device layer 1010 with TF circuitry formed on it. FIG. 10E illustrates the addition of interconnects 1012 to provide electrical connection between the circuitry on TF device layer 1010 and circuitry 1004 on crystalline substrate 1002. As shown, the device-fabrication operations of FIGS. 10A-10D produce distinct spatial groupings of stacked multilayer devices.

Figure 11:
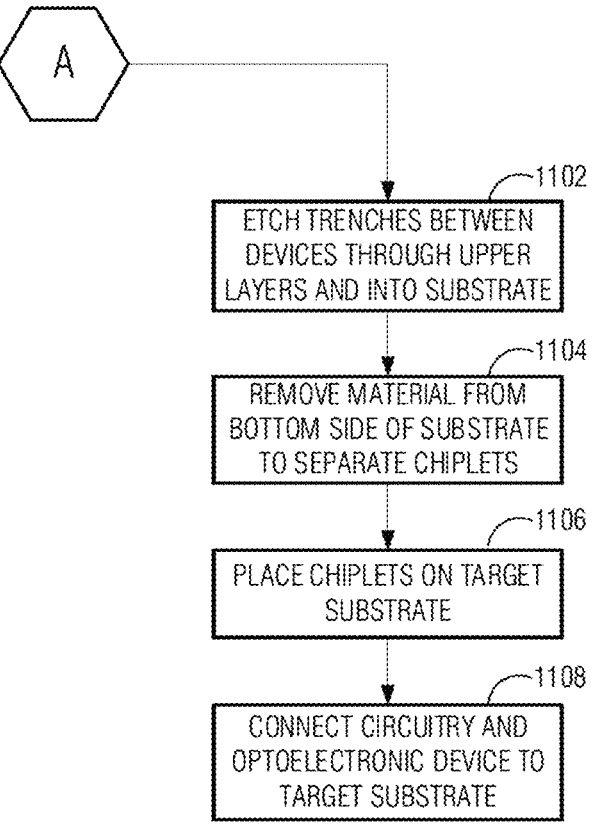
FIG. 11 is a is a process flow diagram illustrating an example sequence of fabrication operations that may be carried out to produce a multilayer chiplet according to various embodiments.

FIG. 11 is a is a process flow diagram illustrating an example sequence of fabrication operations that may be carried out to produce a multilayer chiplet device according to various embodiments. As shown, the process may be a continuation of the fabrication process depicted in FIG. 3, continuing from marker A. At 1102, trenches are formed between the distinct groupings of stacked multilayer devices. The trenches extend through the upper layers and into substrate 1002. Any suitable process may be utilized to create the trenches, such as wet or dry etching. In some embodiments, anisotropic etching is preferred. FIG. 10F illustrates the result of these operations. Trenches 1014 are formed between each of the multilayer device portions. The depth of trenches 1014 is deeper than the depth of intended thickness 1003 as shown.

In operation 1104, material from the bottom side of crystalline substrate 1002 is removed to the intended thickness 1003. Any suitable technique may be used, including wet or dry etching, or chemical-mechanical planarization, for instance. This operation separates the formed multilayer stacks into individual chiplets 1016.

At 1106, the chiplets are distributed and placed on target substrate. At 1108, each of the chiplets is connected to circuitry on the target substrate. FIG. 10G illustrates these operations. Chiplets 1016 are placed on target substrate 1030 at a pitch 1020 that is greater than the pitch 1022 of the devices during fabrication on substrate 1002. Interconnect 1018 is added to provide the electrical connection from each chiplet to circuitry (not shown) on target substrate 1030. Interconnect 1018 may be metal, doped semiconductor, or any suitable conductive material that may be deposited, printed, or otherwise added. Additional details relevant to the manufacture of chiplets may be found in PCT Application No. PCT/US19/67207, filed Dec. 18, 2019, the disclosure of which is incorporated by reference herein.

Figure 12:
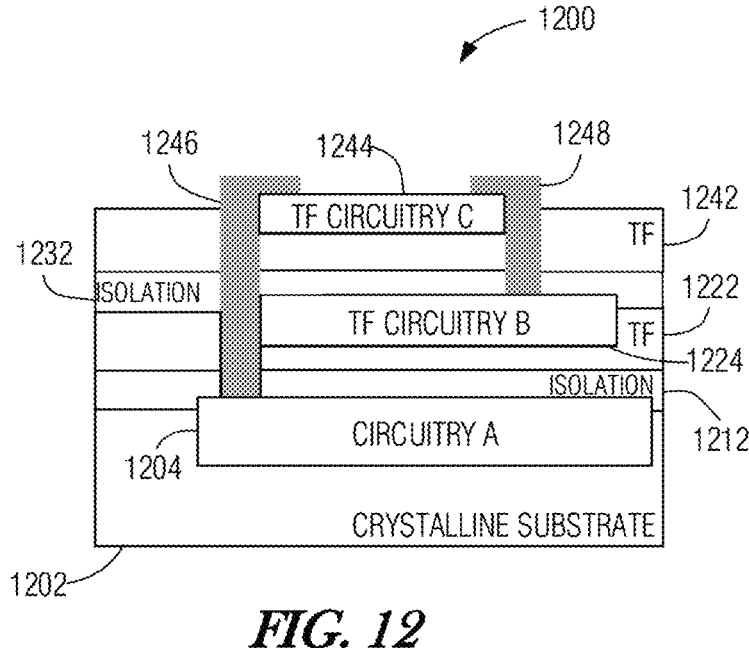
FIG. 12 is a simplified partial cross-sectional-view diagram illustrating a multilayer device portion in which various device layers are integrated using thin-film semiconductor technology with bulk-substrate semiconductor technology.

FIG. 12 is a simplified partial cross-sectional-view diagram illustrating a multilayer device portion 1200 in which various device layers are integrated using thin-film semiconductor technology with bulk-substrate semiconductor technology. The structure of device portion 1200 is similar to device portion 800 described above with reference to FIG. 8, except that this embodiment contemplates that any type of circuitry may be formed on the device layers. In other words, device portion 1200 may have different types of circuitry than photodetector circuitry in two of the device layers as described above in connection with FIG. 8.

Crystalline substrate 1202 is a base substrate layer that is used to form circuitry A 1204. Substrate 1202 may be a group-IV semiconductor, a group-III-V semiconductor, a group-Ill-VI semiconductor, or any other suitable type. Circuitry A 1204 may be an optoelectronic device, such as a photodetector or emitter, or a different device.

Isolation layer 1212 is situated over photodetector A. A first TF device layer 822 is situated over isolation layer 1212, and TF circuitry B 1224, is formed in TF device layer 1222. Isolation layer 1232 may be added over TF circuitry B 1224. A second TF device layer 1242 is situated over isolation layer 1232, and TF circuitry C 1244 is formed in TF device layer 1242. Interconnect 1246 connects TF circuitry C 1244 with circuitry A 1204, and interconnect 1248 connects TF circuitry C 1244 with TF circuitry B 1224.

One or both of TF device layers 1222 or 1242 may be crystalline amorphous, or polycrystalline semiconductor material. Any suitable semiconductor material may be used, as appropriate for the application. For instance, one or both of TF device layers 1222 or 1242 may be low-temperature polysilicon, IGZO, ZnO, SnO, silicon, black silicon, transferred crystalline silicon, boron nitride, graphene, germanium, ZnSnO, CdSe, CuO, PbS, carbon nanotubes, organic semiconductor, 2D materials, quantum-dot (QD)-printed materials, or others. Different device layers may be made from different semiconductor materials to provide correspondingly different operational characteristics for the devices to be formed in those device layers.

Semiconductor material deposited during the fabrication of one or both of TF device layers 1222 or 1242, such as amorphous semiconductor material, may be crystalline (e.g., crystallized or recrystallized) using a suitable technique, such as by laser irradiation. Also, in the fabrication of one or more of circuitry A 1204, TF circuitry B 1224, and TF circuitry C 1244, faster processes (FS) techniques may be used, such as the use of non-equilibrium processes or structures. In addition, self-aligning fabrication techniques (e.g., the use of certain device structures as masking for the fabrication of adjacent structures), may be utilized in the processing of one or more of circuitry A 1204, TF circuitry B 1224, and TF circuitry C 1244.

In some embodiments, the stacking of device layers is ordered such that a first TF device layer having devices requiring higher processing temperatures in their fabrication is fabricated first (i.e., as a lower layer over the substrate than a second TF device layer requiring a lower processing temperature).

Each of circuitry A 1204, TF circuitry B 1224, and TF circuitry C 1244 may consist of NMOS only, PMOS only, or CMOS. In one such example, TF circuitry B 1224 consists of NMOS transistors, whereas TF circuitry B 1244 consists of PMOS transistors. In one embodiment, circuitry A 1204, TF circuitry B 1224, or TF circuitry C 1244 has one or more transducer devices but no transistors.

In various embodiments, circuitry A 1204, TF circuitry B 1224, or TF circuitry C 1244 may include switching circuitry, amplification circuitry, shift registers for addressing functionality, shift registers for data-extracting functionality, sample/hold stages, analog-to-digital conversion circuitry, processor circuitry (e.g., CISC/RISC instruction processing, vector processing, digital signal processing), sensor circuitry (e.g., photodetection, temperature sensing, accelerometer, magnetometer, bolometer, thermopile, load sensing, radiation sensing), actuator circuitry (e.g., light emitter), power control and routing, memory, communication circuitry (e.g., universal asynchronous receiver/transmitter—UART) or radio-frequency circuitry (e.g., radio transceiver, RFID, baseband processing), or other type of circuitry.

Figure 13A:
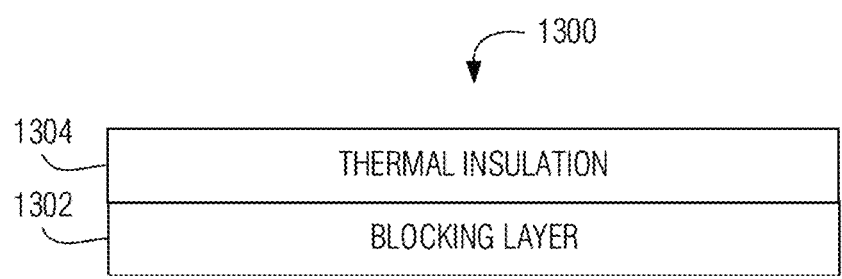
FIGS. 13A-13B are simplified partial cross-sectional view diagrams illustrating example compound isolation layer structures according to some embodiments.
Figure 13B:
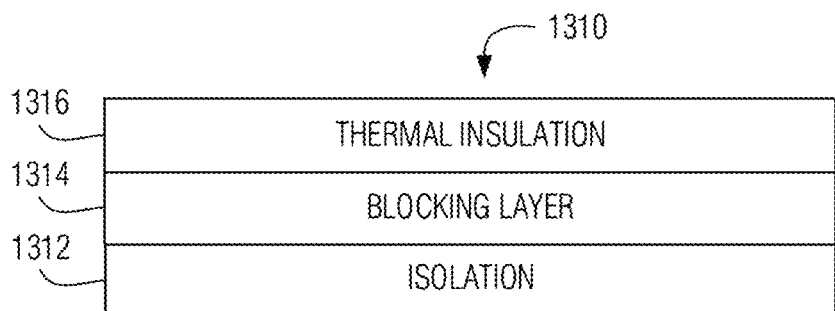

FIGS. 13A-13B are simplified partial cross-sectional view diagrams illustrating example compound isolation layer structures according to some embodiments. Referring first to FIG. 13A, a compound isolation layer 1300 is depicted, which includes blocking layer 1302 and a thermal insulation layer 1304. Compound isolation layer 1300 may be used as one or more isolation layers in any of the example embodiments described above.

Compound isolation layer 1300 may be used in particular embodiments in which large amounts of heat, light, or other radiant energy are applied in the fabrication of a TF device layer, which energy is capable of damaging a device layer beneath that TF device layer being fabricated. For instance, a crystallization process using laser heating of a deposited TF semiconductor layer to melt the deposited semiconductor can damage an underlying device by excessive heat conduction from the targeted layer being processed, or by heating from absorption of laser light that passes through the targeted layer.

Accordingly, in the embodiment shown, thermal insulation layer 1304 protects the underlying device layer from conduction of heat, while blocking layer 1302 refracts, reflects, or absorbs any laser radiation that penetrates the targeted layer being processed and thermal insulation layer 1304. For example, silicon nitride and silicon oxide have favorable properties as thermal insulators, but are transparent to certain wavelengths of light. Accordingly, these materials are examples of heat-insulating materials that can be used as thermal insulation layer 1304, but may not be sufficient to protect underlying layers from transmission of laser light at certain wavelengths. Accordingly, light-blocking materials such as zinc oxide, amorphous silicon, titanium dioxide, metal, or other suitable material, may be added as blocking layer 1302.

FIG. 13B illustrates compound isolation layer 1310 according to a related embodiment. As shown, isolation layer 1310 has three layers: thermal insulation layer 1316, blocking layer 1314, and isolation layer 1312. Thermal insulation layer 1316 and blocking layer 1314 are similar to thermal insulation layer 1304 and blocking layer 1302 discussed above with reference to FIG. 13A. Isolation layer 1312 is provided beneath blocking layer 1314 in this embodiment to permit the use of blocking layer 1314 in a device where blocking layer cannot be added directly over a device layer. For instance, blocking layer 1314 may have certain electrical characteristics, such as conductivity, which might interfere with the operation of the circuitry of the immediately-underlying device. As another example, blocking layer 1314 may be chemically or physically incompatible with the immediately-underlying device layer, in which case isolation layer 1312, composed of a material that is compatible with both, blocking layer 1314, and the underlying device layer, serves to prevent undesired chemical or physical interactions between incompatible materials of blocking layer 1314 and the underlying device layer. Isolation layer 1312 may be an oxide film, un-doped semiconductor film, nitride film, or other suitable material.

Additional Notes and Examples:

Example 1 is an integrated circuit (IC) comprising: a substrate composed of crystalline semiconductor, the substrate comprising a substrate top surface and a substrate bottom surface opposite the top surface; an optoelectronic device formed at the substrate top surface, the optoelectronic device comprising a plurality of transducers; a thin-film semiconductor layer deposited over the optical device, the thin-film semiconductor layer having a thin-film top surface; and circuitry, including a plurality of transistors, formed at the thin-film top surface, the circuitry being electrically coupled to the optoelectronic device by a set of layer interconnects.

In Example 2, the subject matter of Example 1 includes, wherein the optoelectronic device is an image sensor and wherein the plurality of transducers are arranged as an array of photodetectors.

In Example 3, the subject matter of Examples 1-2 includes, an isolation layer formed between the first surface and the optoelectronic device and the thin-film semiconductor layer, the isolation layer including a set of apertures through which the set of layer interconnects pass.

In Example 4, the subject matter of Example 3 includes, wherein the isolation layer comprises a nitride film.

In Example 5, the subject matter of Examples 3-4 includes, wherein the isolation layer comprises an oxide film.

In Example 6, the subject matter of Examples 3-5 includes, wherein the isolation layer is a compound layer comprising a plurality of layers of different materials.

In Example 7, the subject matter of Example 6 includes, wherein the plurality of layers of different materials of the compound layer include a thermal insulation layer and a light-blocking layer.

In Example 8, the subject matter of Example 7 includes, wherein the plurality of layers of different materials of the compound layer further include an isolation layer that is distinct from the thermal insulation layer and the light-blocking layer.

In Example 9, the subject matter of Examples 7-8 includes, wherein the insulation layer comprises a thin-film thermally-insulating material selected from the group consisting of: silicon nitride film, silicon dioxide film, or amorphous silicon.

In Example 10, the subject matter of Examples 7-9 includes, wherein the light-blocking layer comprises a light-blocking material selected from the group consisting of zinc oxide, titanium dioxide, metal, or amorphous silicon.

In Example 11, the subject matter of Examples 1-8 includes, wherein the thin-film semiconductor layer is formed according to a process that includes deposition of amorphous semiconductor material followed by crystallization of the amorphous semiconductor material to create a crystalline thin film.

In Example 12, the subject matter of Examples 1-11 includes, wherein the substrate and the thin-film semiconductor layer are composed of chemically different types of semiconductor material.

In Example 13, the subject matter of Example 12 includes, wherein the substrate semiconductor type is a group-IV semiconductor.

In Example 14, the subject matter of Example 12 includes, wherein the substrate semiconductor type is a compound semiconductor selected from the group consisting of a III-V semiconductor or a III-VI semiconductor.

In Example 15, the subject matter of Examples 12-14 includes, wherein the thin-film semiconductor layer includes a semiconductor material selected from the group consisting of: low-temperature polysilicon, IGZO, ZnO, SnO, silicon, black silicon, transferred crystalline silicon, boron nitride, graphene, germanium, ZnSnO, CdSe, CuO, PbS, carbon nanotubes, organic semiconductor, 2D materials, and quantum-dot (QD)-printed materials.

In Example 16, the subject matter of Examples 1-15 includes, wherein the circuitry comprises a plurality of transistors.

In Example 17, the subject matter of Examples 1-16 includes, wherein the circuitry includes an addressing portion arranged to provide selective access to portions of the optoelectronic device.

In Example 18, the subject matter of Examples 1-17 includes, wherein the circuitry includes amplification circuitry arranged to amplify signaling generated by the optoelectronic device.

In Example 19, the subject matter of Examples 1-18 includes, wherein the circuitry includes shift-register circuitry electrically coupled to the optoelectronic device.

In Example 20, the subject matter of Examples 1-19 includes, wherein the circuitry includes analog-to-digital converter circuitry electrically coupled to the optoelectronic device.

In Example 21, the subject matter of Examples 1-20 includes, wherein the circuitry includes processor circuitry electrically coupled to the optoelectronic device.

In Example 22, the subject matter of Examples 1-21 includes, wherein the circuitry includes sensor circuitry.

In Example 23, the subject matter of Examples 1-22 includes, wherein the circuitry includes light-emission circuitry.

In Example 24, the subject matter of Examples 1-23 includes, wherein the circuitry includes image-sensing circuitry.

In Example 25, the subject matter of Examples 1-24 includes, wherein the circuitry includes power-control circuitry electrically coupled to the optoelectronic device.

In Example 26, the subject matter of Examples 1-25 includes, wherein the circuitry includes memory circuitry electrically coupled to the optoelectronic device.

In Example 27, the subject matter of Examples 1-26 includes, wherein the circuitry includes communication circuitry electrically coupled to the optoelectronic device.

In Example 28, the subject matter of Examples 1-27 includes, wherein the circuitry includes bolometry circuitry.

In Example 29, the subject matter of Examples 1-28 includes, wherein the circuitry includes a digital control portion arranged to decode commands directed to the optoelectronic device to produce control signaling and to electrically couple the control signaling to the optoelectronic device.

In Example 30, the subject matter of Examples 1-29 includes, wherein the optoelectronic device includes a plurality of photodetectors, and wherein corresponding to each of the plurality of photodetectors, the circuitry includes: amplifier circuit having an amplifier input coupled to that photodetector; a reset circuit having a reset input, the reset circuit arranged to configure the amplifier to operatively respond to an output of the photodetector in response to assertion of the resent input; and an output-enable circuit having a select input, the output-enable circuit arranged to connect and disconnect an output of the amplifier circuit to a data output node based on signaling at the select input.

In Example 31, the subject matter of Example 30 includes, wherein the circuitry further includes a plurality of global shutter circuits corresponding to respective ones of the plurality of photodetectors, each of the global shutter circuits including a disconnect switch arranged to connect and disconnect the respective photodetector from the amplifier circuit based on a global shutter input signal.

In Example 32, the subject matter of Example 30 includes, a plurality of global shutter circuits formed at the substrate top surface, the global shutter circuits corresponding to respective ones of the plurality of photodetectors, each of the global shutter circuits including a disconnect switch arranged to connect and disconnect the respective photodetector from the circuitry based on a global shutter input signal.

In Example 33, the subject matter of Examples 1-32 includes, a second thin-film semiconductor layer deposited over the optical device, the second thin-film semiconductor layer having a second thin-film top surface; and second circuitry formed at the thin-film top surface, the second circuitry being electrically coupled to the circuitry of the thin-film semiconductor layer by a second set of layer interconnects.

In Example 34, the subject matter of Example 33 includes, wherein the second circuitry comprises a second optoelectronic device electrically coupled to the circuitry of the thin-film semiconductor layer.

In Example 35, the subject matter of Example 34 includes, wherein the optoelectronic device of the substrate includes first-type photodetectors sensitive to a first range of wavelengths of light, and the second optoelectronic device includes second-type photodetectors sensitive to a second range of wavelengths of light that is different from the first range.

In Example 36, the subject matter of Examples 34-35 includes, wherein the optoelectronic device of the substrate includes an image sensor, and the second optoelectronic device includes a light-emitting device.

In Example 37, the subject matter of Examples 33-36 includes, wherein the second thin-film semiconductor layer is deposited over the thin-film semiconductor layer.

In Example 38, the subject matter of Examples 33-37 includes, wherein the circuitry consists of NMOS transistors and wherein the second circuitry consists of PMOS circuitry.

In Example 39, the subject matter of Examples 1-38 includes, wherein the IC has a footprint area defined by its length and width dimensions, and wherein the optoelectronic device occupies most of the area of the footprint.

In Example 40, the subject matter of Examples 1-39 includes, wherein the IC is a chiplet in which the optoelectronic device is a portion of a greater image sensor.

Example 41 is a multilayer semiconductor device produced by a process comprising: forming first circuitry at a crystalline semiconductor substrate; depositing an isolation layer over the first circuitry; patterning the isolation layer to form apertures therein; depositing a thin-film (TF) semiconductor layer over isolation layer; forming second circuitry at the TF semiconductor layer; and interconnecting the first circuitry with the second circuitry through the apertures.

In Example 42, the subject matter of Example 41 includes, wherein in the process: forming the first circuitry includes forming first distinct spatial groupings; forming the second circuitry includes forming second distinct spatial groupings stacked over respective ones of the first distinct spatial groupings to produce distinct multilayer stacks; and wherein the process further comprises: separating the distinct multilayer stacks from one another to produce a plurality of distributable chiplets.

In Example 43, the subject matter of Example 42 includes, wherein in the process: forming the first and the second distinct spatial groupings produce the distinct multilayer stacks spaced apart at a first pitch; and wherein the process further comprises: after separating the distinct multilayer stacks from one another to produce a plurality of distributable chiplets, placing the plurality of chiplets on a target substrate such that the plurality of chiplets are spaced apart at a second pitch that is greater than the first pitch; and electrically connecting each of the chiplets to circuitry on the target substrate.

In Example 44, the subject matter of Examples 41-43 includes, wherein in the process: depositing the TF semiconductor layer includes depositing semiconductor material that is of a different chemical composition than the crystalline semiconductor substrate.

In Example 45, the subject matter of Example 44 includes, wherein the substrate semiconductor type is a group-IV semiconductor.

In Example 46, the subject matter of Example 44 includes, wherein the substrate semiconductor type is a III-V semiconductor or a III-VI semiconductor.

In Example 47, the subject matter of Examples 44-46 includes, wherein in the process, depositing the TF semiconductor layer includes depositing a semiconductor material selected from the group consisting of: low-temperature polysilicon, IGZO, ZnO, SnO, silicon, black silicon, transferred crystalline silicon, boron nitride, graphene, germanium, ZnSnO, CdSe, CuO, PbS, carbon nanotubes, organic semiconductor, 2D materials, and quantum-dot (QD)-printed materials.

In Example 48, the subject matter of Examples 41-47 includes, wherein in the process, depositing the TF semiconductor layer includes depositing an amorphous TF semiconductor layer; and wherein the process further comprises: after depositing the amorphous TF semiconductor layer, crystallizing the TF semiconductor layer.

In Example 49, the subject matter of Example 48 includes, wherein in the process, crystallizing the TF semiconductor layer includes melting portions of the deposited TF semiconductor layer using a laser.

In Example 50, the subject matter of Examples 41-49 includes, wherein in the process, forming the first circuitry includes forming a set of optoelectronic devices.

In Example 51, the subject matter of Example 50 includes, wherein in the process, forming the second circuitry includes forming switching and amplification circuitry to be interconnected with the set of optoelectronic devices.

In Example 52, the subject matter of Examples 41-51 includes, wherein in the process, depositing the isolation layer includes depositing a thin film of isolation material selected from the group consisting of: a nitride film, an oxide film, or a combination thereof.

In Example 53, the subject matter of Examples 41-52 includes, wherein in the process, depositing the isolation layer includes depositing a light-blocking layer and depositing a thermal-insulating layer to produce a compound isolation layer.

In Example 54, the subject matter of Examples 41-53 includes, wherein in the process: forming the first circuitry includes forming a set of transducers; and forming the second circuitry includes forming a set of transistors.

In Example 55, the subject matter of Examples 41-54 includes, wherein in the process, forming the first circuitry omits forming any transistors.

In Example 56, the subject matter of Examples 41-55 includes, wherein in the process: forming the first circuitry includes forming a first photodetector sensitive to a first range of wavelengths; and forming the second circuitry includes forming a second photodetector sensitive to a second range of wavelengths different from the first range.

In Example 57, the subject matter of Examples 41-56 includes, wherein the process further comprises: depositing a second isolation layer over the second circuitry; patterning the second isolation layer to form apertures therein; depositing a second TF semiconductor layer over the second isolation layer; forming third circuitry at the second TF semiconductor layer; and interconnecting the first or the second circuitry with the third circuitry through the apertures of at least the second isolation layer.

Example 58 is a method for fabricating a multilayer semiconductor device, the method comprising: providing a crystalline semiconductor substrate; forming first circuitry at the crystalline semiconductor substrate; depositing an isolation layer over the first circuitry; patterning the isolation layer to form apertures therein; depositing a thin-film (TF) semiconductor layer over isolation layer; forming second circuitry at the TF semiconductor layer; and interconnecting the first circuitry with the second circuitry through the apertures.

In Example 59, the subject matter of Example 58 includes, wherein: forming the first circuitry includes forming first distinct spatial groupings; forming the second circuitry includes forming second distinct spatial groupings stacked over respective ones of the first distinct spatial groupings to produce distinct multilayer stacks; and wherein the method further comprises: separating the distinct multilayer stacks from one another to produce a plurality of distributable chiplets.

In Example 60, the subject matter of Example 59 includes, wherein: forming the first and the second distinct spatial groupings produce the distinct multilayer stacks spaced apart at a first pitch; and wherein the method further comprises: after separating the distinct multilayer stacks from one another to produce a plurality of distributable chiplets, placing the plurality of chiplets on a target substrate such that the plurality of chiplets are spaced apart at a second pitch that is greater than the first pitch; and electrically connecting each of the chiplets to circuitry on the target substrate.

In Example 61, the subject matter of Examples 58-60 includes, wherein depositing the TF semiconductor layer includes depositing semiconductor material that is of a different chemical composition than the crystalline semiconductor substrate.

In Example 62, the subject matter of Example 61 includes, wherein providing the crystalline semiconductor substrate includes providing a substrate semiconductor that is a group-IV semiconductor.

In Example 63, the subject matter of Example 61 includes, wherein providing the crystalline semiconductor substrate includes providing a substrate semiconductor that is a III-V semiconductor or a III-VI semiconductor.

In Example 64, the subject matter of Examples 61-63 includes, wherein depositing the TF semiconductor layer includes depositing a semiconductor material selected from the group consisting of: low-temperature polysilicon, IGZO, ZnO, SnO, silicon, black silicon, transferred crystalline silicon, boron nitride, graphene, germanium, ZnSnO, CdSe, CuO, PbS, carbon nanotubes, organic semiconductor, 2D materials, and quantum-dot (QD)-printed materials.

In Example 65, the subject matter of Examples 58-64 includes, wherein depositing the TF semiconductor layer includes depositing an amorphous TF semiconductor layer; and wherein the method further comprises: after depositing the amorphous TF semiconductor layer, crystallizing the TF semiconductor layer.

In Example 66, the subject matter of Example 65 includes, wherein crystallizing the TF semiconductor layer includes melting portions of the deposited TF semiconductor layer using a laser.

In Example 67, the subject matter of Examples 58-66 includes, wherein forming the first circuitry includes forming a set of transducer devices.

In Example 68, the subject matter of Example 67 includes, wherein forming the second circuitry includes forming switching and amplification circuitry to be interconnected with the set of transducer devices.

In Example 69, the subject matter of Examples 67-68 includes, wherein forming the set of transducer devices includes forming a set of photodetectors.

In Example 70, the subject matter of Examples 67-69 includes, wherein forming the second circuitry includes forming processor circuitry electrically coupled to the set of transducer devices.

In Example 71, the subject matter of Examples 67-70 includes, wherein forming the second circuitry includes forming communication circuitry electrically coupled to the set of transducer devices.

In Example 72, the subject matter of Examples 67-71 includes, wherein forming the second circuitry includes forming bolometry circuitry.

In Example 73, the subject matter of Examples 67-72 includes, wherein forming the second circuitry includes forming a second set of transducers of a different type than the set of transducer devices.

In Example 74, the subject matter of Examples 67-73 includes, wherein forming the second circuitry includes forming analog-to-digital converter circuitry electrically coupled to the set of transducer devices.

In Example 75, the subject matter of Examples 67-74 includes, wherein forming the second circuitry includes forming a set of transistors electrically coupled to the set of transducer devices.

In Example 76, the subject matter of Examples 67-75 includes, wherein forming the second circuitry includes forming a set of light emitters.

In Example 77, the subject matter of Examples 58-76 includes, wherein in the process, depositing the isolation layer includes depositing a thin film of isolation material selected from the group consisting of: a nitride film, an oxide film, or a combination thereof.

In Example 78, the subject matter of Examples 58-77 includes, wherein in the process, depositing the isolation layer includes depositing a light-blocking layer and depositing a thermal-insulating layer to produce a compound isolation layer.

In Example 79, the subject matter of Examples 58-78 includes, wherein in the process, forming the first circuitry omits forming any transistors.

In Example 80, the subject matter of Examples 58-79 includes, wherein: forming the first circuitry includes forming a first photodetector sensitive to a first range of wavelengths; and forming the second circuitry includes forming a second photodetector sensitive to a second range of wavelengths different from the first range.

In Example 81, the subject matter of Examples 58-80 includes, depositing a second isolation layer over the second circuitry; patterning the second isolation layer to form apertures therein; depositing a second TF semiconductor layer over the second isolation layer; forming third circuitry at the second TF semiconductor layer; and interconnecting the first or the second circuitry with the third circuitry through the apertures of at least the second isolation layer.

In Example 82, the subject matter of Examples 58-81 includes, wherein forming the first circuitry includes forming a plurality of photodetectors, and wherein forming the second circuitry includes forming a set of support circuitry corresponding to each of the plurality of photodetectors, the support circuitry including: amplifier circuit having an amplifier input coupled to that photodetector; a reset circuit having a reset input, the reset circuit arranged to configure the amplifier to operatively respond to an output of the photodetector in response to assertion of the resent input; and an output-enable circuit having a select input, the output-enable circuit arranged to connect and disconnect an output of the amplifier circuit to a data output node based on signaling at the select input.

In Example 83, the subject matter of Example 82 includes, wherein forming the second circuitry further includes forming a plurality of global shutter circuits corresponding to respective ones of the plurality of photodetectors, each of the global shutter circuits including a disconnect switch arranged to connect and disconnect the respective photodetector from the amplifier circuit based on a global shutter input signal.

In Example 84, the subject matter of Example 82 includes, wherein forming the first circuitry further includes forming a plurality of global shutter circuits at the substrate, the global shutter circuits corresponding to respective ones of the plurality of photodetectors, each of the global shutter circuits including a disconnect switch arranged to connect and disconnect the respective photodetector from the second circuitry based on a global shutter input signal.

Example 86 is an apparatus comprising means to implement of any of Examples 1-84.

Example 87 is a system to implement of any of Examples 1-84. Example 88 is a method to implement of any of Examples 1-84.

The above description is intended to be illustrative, and not restrictive. For example, the above-described examples (or one or more aspects thereof) may be used in combination with others. Other embodiments may be used, such as by one of ordinary skill in the art upon reviewing the above description. Persons of ordinary skill in the relevant arts will recognize that the invention may comprise fewer features than illustrated in any individual embodiment described above. The embodiments described herein are not meant to be an exhaustive presentation of the ways in which the various features of the invention may be combined. Accordingly, the embodiments are not mutually exclusive combinations of features; rather, the invention may comprise a combination of different individual features selected from different individual embodiments, as will be understood by persons of ordinary skill in the art.

Thus, the following claims are hereby incorporated into the Detailed Description, with a claim standing on its own as a separate embodiment. The scope of the embodiments disclosed herein is to be determined with reference to the appended claims, along with the full scope of equivalents to which such claims are entitled.

The Abstract is to allow the reader to quickly ascertain the nature of the technical disclosure. It is submitted with the understanding that it will not be used to interpret or limit the scope or meaning of the claims.

Any incorporation by reference of documents above is limited such that no subject matter is incorporated that is contrary to the explicit disclosure herein. Any incorporation by reference of documents above is further limited such that any claims that are included in the documents are incorporated by reference into the Detailed Description of the present document rather than the claims. Any incorporation by reference of documents above is yet further limited such that any definitions provided in the documents are not incorporated by reference herein unless expressly included herein.

For purposes of interpreting the claims, it is expressly intended that the provisions of Section 112(f) of 35 U.S.C. are not to be invoked unless the specific terms "means for" or "step for" are recited in a claim.

The invention claimed is:

1. An integrated circuit (IC) comprising:
a substrate composed of crystalline semiconductor, the substrate comprising a substrate top surface and a substrate bottom surface opposite the top surface;
an optoelectronic device formed at the substrate top surface, the optoelectronic device comprising a plurality of transducers;
a thin-film semiconductor layer deposited over the optoelectronic device, the thin-film semiconductor layer having a thin-film top surface;

circuitry, including a plurality of transistors, formed at the thin-film top surface, the circuitry being electrically coupled to the optoelectronic device by a set of layer interconnects.

2. The IC of claim 1, wherein the optoelectronic device is an image sensor and wherein the plurality of transducers are arranged as an array of photodetectors.

3. The IC of claim 1, further comprising:

an isolation layer formed between the first surface and the optoelectronic device and the thin-film semiconductor layer, the isolation layer including a set of apertures through which the set of layer interconnects pass.

4. The IC of claim 3, wherein the isolation layer is a compound layer comprising a plurality of layers of different materials.

5. The IC of claim 4, wherein the plurality of layers of different materials of the compound layer include a thermal insulation layer and a light-blocking layer.

6. The IC of claim 5, wherein the plurality of layers of different materials of the compound layer further include an isolation layer that is distinct from the thermal insulation layer and the light-blocking layer.

7. The IC of claim 1, wherein the thin-film semiconductor layer is formed according to a process that includes deposition of amorphous semiconductor material followed by crystallization of the amorphous semiconductor material to create a crystalline thin film.

8. The IC of claim 1, wherein the substrate and the thin-film semiconductor layer are composed of chemically different types of semiconductor material.

9. The IC of claim 1, wherein the circuitry comprises a plurality of transistors.

10. The IC of claim 1, wherein the circuitry includes an addressing portion arranged to provide selective access to portions of the optoelectronic device.

11. The IC of claim 1, wherein the circuitry includes amplification circuitry arranged to amplify signaling generated by the optoelectronic device.

12. The IC of claim 1, wherein the circuitry includes sensor circuitry.

13. The IC of claim 1, wherein the circuitry includes light-emission circuitry.

14. The IC of claim 1, wherein the circuitry includes a digital control portion arranged to decode commands directed to the optoelectronic device to produce control signaling and to electrically couple the control signaling to the optoelectronic device.

15. The IC of claim 1, wherein the optoelectronic device includes a plurality of photodetectors, and wherein corresponding to each of the plurality of photodetectors, the circuitry includes:

amplifier circuit having an amplifier input coupled to that photodetector;

a reset circuit having a reset input, the reset circuit arranged to configure the amplifier to operatively respond to an output of the photodetector in response to assertion of the resent input; and an output-enable circuit having a select input, the output-enable circuit arranged to connect and disconnect an output of the amplifier circuit to a data output node based on signaling at the select input.

16. The IC of claim 15, wherein the circuitry further includes a plurality of global shutter circuits corresponding to respective ones of the plurality of photodetectors, each of the global shutter circuits including a disconnect switch arranged to connect and disconnect the respective photodetector from the amplifier circuit based on a global shutter input signal.

17. The IC of claim 15, further comprising a plurality of global shutter circuits formed at the substrate top surface, the global shutter circuits corresponding to respective ones of the plurality of photodetectors, each of the global shutter circuits including a disconnect switch arranged to connect and disconnect the respective photodetector from the circuitry based on a global shutter input signal.

18. The IC of claim 1, further comprising:

a second thin-film semiconductor layer deposited over the optoelectronic device, the second thin-film semiconductor layer having a second thin-film top surface; and second circuitry formed at the thin-film top surface, the second circuitry being electrically coupled to the circuitry of the thin-film semiconductor layer by a second set of layer interconnects;

wherein the second circuitry comprises a second optoelectronic device electrically coupled to the circuitry of the thin-film semiconductor layer; and wherein the optoelectronic device of the substrate includes first-type photodetectors sensitive to a first range of wavelengths of light, and the second optoelectronic device includes second-type photodetectors sensitive to a second range of wavelengths of light that is different from the first range.

19. The IC of claim 18, wherein the optoelectronic device of the substrate includes an image sensor, and the second optoelectronic device includes a light-emitting device.

20. The IC of claim 18, wherein the second thin-film semiconductor layer is deposited over the thin-film semiconductor layer.

21. The IC of claim 18, wherein the circuitry consists essentially of NMOS circuitry and wherein the second circuitry consists essentially of PMOS circuitry.

22. The IC of claim 1, wherein the IC has a footprint area defined by its length and width dimensions, and wherein the optoelectronic device occupies most of the area of the footprint.

23. The IC of claim 1, wherein the IC is a chiplet in which the optoelectronic device is a portion of a greater image sensor.

* * * * *